(12) United States Patent
Yang

(10) Patent No.: US 10,978,419 B1
(45) Date of Patent: Apr. 13, 2021

(54) SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/600,587

(22) Filed: Oct. 14, 2019

(51) Int. Cl.
*H01L 23/495* (2006.01)
*H01L 21/60* (2006.01)
*H01L 25/07* (2006.01)
*H01L 23/00* (2006.01)

(52) U.S. Cl.
CPC ............. *H01L 24/48* (2013.01); *H01L 24/06* (2013.01); *H01L 24/49* (2013.01); *H01L 24/85* (2013.01); *H01L 2224/02373* (2013.01); *H01L 2224/02375* (2013.01); *H01L 2224/02381* (2013.01); *H01L 2224/04042* (2013.01); *H01L 2224/0603* (2013.01); *H01L 2224/06102* (2013.01); *H01L 2224/06177* (2013.01); *H01L 2224/4813* (2013.01); *H01L 2224/48106* (2013.01); *H01L 2224/48227* (2013.01); *H01L 2224/48991* (2013.01); *H01L 2224/49107* (2013.01); *H01L 2224/49112* (2013.01); *H01L 2224/49113* (2013.01); *H01L 2224/49175* (2013.01)

(58) Field of Classification Search
CPC ......... H01L 24/06; H01L 24/48; H01L 24/49; H01L 24/85
See application file for complete search history.

(56) References Cited

U.S. PATENT DOCUMENTS

2006/0197234 A1* 9/2006 Pape ..................... H01L 24/49
257/784
2012/0313228 A1* 12/2012 Haba ..................... H01L 23/552
257/668

* cited by examiner

*Primary Examiner* — David C Spalla
(74) *Attorney, Agent, or Firm* — CKC & Partners Co., LLC

(57) ABSTRACT

A semiconductor package includes a substrate and a semiconductor chip, a lower conductive layer and an upper conductive layer sequentially stacked on the substrate. The substrate includes first and second connection pads formed thereon. The semiconductor chip includes third and fourth connection pads formed thereon. The upper conductive layer is connected to the first and the third connection pads via a first and a second wiring, and the lower conductive layer is connected to the second and the fourth connection pads via a third and a fourth wiring.

18 Claims, 11 Drawing Sheets

SEMICONDUCTOR PACKAGE AND MANUFACTURING METHOD THEREOF

BACKGROUND

Field of the Invention

The present disclosure relates to a semiconductor device. More particularly, the present disclosure relates to a semiconductor device with enhanced connection.

Description of Related Art

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices. Numerous manufacturing steps are undertaken in the production of such semiconductor packages.

However, the manufacturing of semiconductor devices in a miniaturized scale is becoming more complicated. For example, the integration of large numbers of tiny MOS transistors into a small chip results in circuits that are orders of magnitude smaller, faster, and less expensive than those constructed of discrete electronic components. However, with the requirement of smaller and faster components in a chip, the current requirement is increasing as well. Undesired signal distortion and power supply voltage drop (i.e., IR drop) are caused while tiny metal wires of the chip transfer the signal with large electrical current, and noise problem is also caused in ground connection or power connection of the chip.

SUMMARY

One aspect of the disclosure is a semiconductor package, including: a substrate including: a first top surface; and a number of first connection pads and a number of second connection pads disposed on the first top surface; a semiconductor chip disposed on the first top surface, the semiconductor chip includes: a second top surface; and a number of third connection pads and a number of fourth connection pads disposed on the second top surface; a first lower conductive layer disposed on the second top surface; a first upper conductive layer disposed on the first lower conductive layer; a number of first wirings connecting between the first connection pads and the first upper conductive layer; a number of second wirings connecting between the second connection pads and the first lower conductive layer; a number of third wirings connecting between the third connection pads and the first upper conductive layer; and a number of fourth wirings connecting between the fourth connection pads and the first lower conductive layer.

In some embodiments, a projection area of the first lower conductive layer on the second top surface is larger than a projection area of the first upper conductive layer on the second top surface. In some embodiments, a projection area of the first upper conductive layer on the first lower conductive layer expose two opposite sides of the first lower conductive layer, and the first wirings and the third wirings are connected to the exposed sides of the first lower conductive layer.

In some embodiments, the semiconductor package further includes a number of first redistribution layers and a number of second auxiliary wirings. The first redistribution layers are disposed on the second top surface and located below the first lower conductive layer. The first redistribution layers are respectively connected to the third connection pads and extend from the third connection pads to a peripheral of the semiconductor chip. The second redistribution layers are disposed on the second top surface and located below the first lower conductive layer. The second redistribution layers are respectively connected to the fourth connection pads and extend from the fourth connection pads to the peripheral of the semiconductor chip. A number of first auxiliary wirings are connected between the first connection pads and the first redistribution layers, and a number of second auxiliary wirings are connected between the second connection pads and the second redistribution layers.

In some embodiments, the semiconductor package further includes a number of adhesive layers. One of the adhesive layers is disposed between the first lower conductive layer and semiconductor chip. The adhesive layer insulates the first lower conductive layer from the semiconductor chip. Another adhesive layer is disposed between the first lower conductive layer and first upper conductive layer. The adhesive layer insulates the first lower conductive layer from the first upper conductive layer.

In some embodiments, the first connection pads are connected to a power supply, and the third connection pads are power-supply pads of the semiconductor chip. In some embodiments, the second connection pads are grounded, and the fourth connection pads are ground voltage pads of the semiconductor chip.

In some embodiments, the third connection pads and the fourth connection pads are arranged along a central line of the second top surface.

In some embodiments, the second top surface defines a first region and a second region at two sides of the central line, the first lower conductive layer and the first upper conductive layer are located over the first region. The semiconductor package further includes: a number of fifth connection pads and a number of sixth connection pads disposed on the first top surface; a second lower conductive layer disposed on the second top surface and located over the second region; a second upper conductive layer disposed on the second lower conductive layer; a number of fifth wirings connecting between the fifth connection pads and the second upper conductive layer; a number of sixth wirings connecting between the sixth connection pads and the second lower conductive layer; a number of seventh wirings connecting between the third connection pads and the second upper conductive layer; and a number of eighth wirings connecting between the fourth connection pads and the second lower conductive layer.

In some embodiments, the first connection pads and the second connection pads are located adjacent to a first side of the substrate, and the fifth connection pads and the sixth connection pads are located adjacent to a second side of the substrate that is opposite to the first side. In some embodiments, the fifth connection pads are connected to a power supply, and the sixth connection pads are grounded.

Another aspect of the disclosure is a method for manufacturing a semiconductor package including placing a semiconductor chip on a first top surface of a substrate, wherein a number of first connection pads and a number of second connection pads are disposed on the first top surface; placing a first lower conductive layer over a second top surface of the semiconductor chip, wherein a number of third connection pads and a number of fourth connection pads are disposed on the second top surface; placing a first upper conductive layer over the first lower conductive layer; forming a number of first wirings from the first connection pads and the first upper conductive layer; forming a number of second wirings from the second connection pads and the first lower conductive layer; forming a number of third wirings from the third connection pads and the first upper conductive layer; and forming a number of fourth wirings from the fourth connection pads and the first lower conductive layer.

In some embodiments, the semiconductor chip further includes a number of first redistribution layers disposed on the second top surface and located below the first lower conductive layer, and the method further includes: forming a number of first auxiliary wirings connecting between the first connection pads and the first redistribution layers.

In some embodiments, the semiconductor chip further includes a number of second redistribution layers disposed on the second top surface and located below the first lower conductive layer, and the method further includes: forming a number of second auxiliary wirings connecting between the second connection pads and the second redistribution layers.

In some embodiments, the first lower conductive layer is attached to the second top surface via an adhesive layer, and the first upper conductive layer is attached to the first lower conductive layer via another adhesive layer.

In some embodiments, the first connection pads are connected to a power supply, and the third connection pads are power-supply pads of the semiconductor chip. The second connection pads are grounded, and the fourth connection pads are ground voltage pads of the semiconductor chip.

In some embodiments, the semiconductor package further includes a number of fifth connection pads and a number of sixth connection pads disposed on the first top surface, and the method further including: placing a second lower conductive layer over the second top surface of the semiconductor chip; placing a second upper conductive layer over the second lower conductive layer; forming a number of fifth wirings from the fifth connection pads to the second upper conductive layer; forming a number of sixth wirings from the six connection pads to the second lower conductive layer; forming a number of seventh wirings from the third connection pads to the second upper conductive layer; and forming a number of eighth wirings from the fourth connection pads to the second lower conductive layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
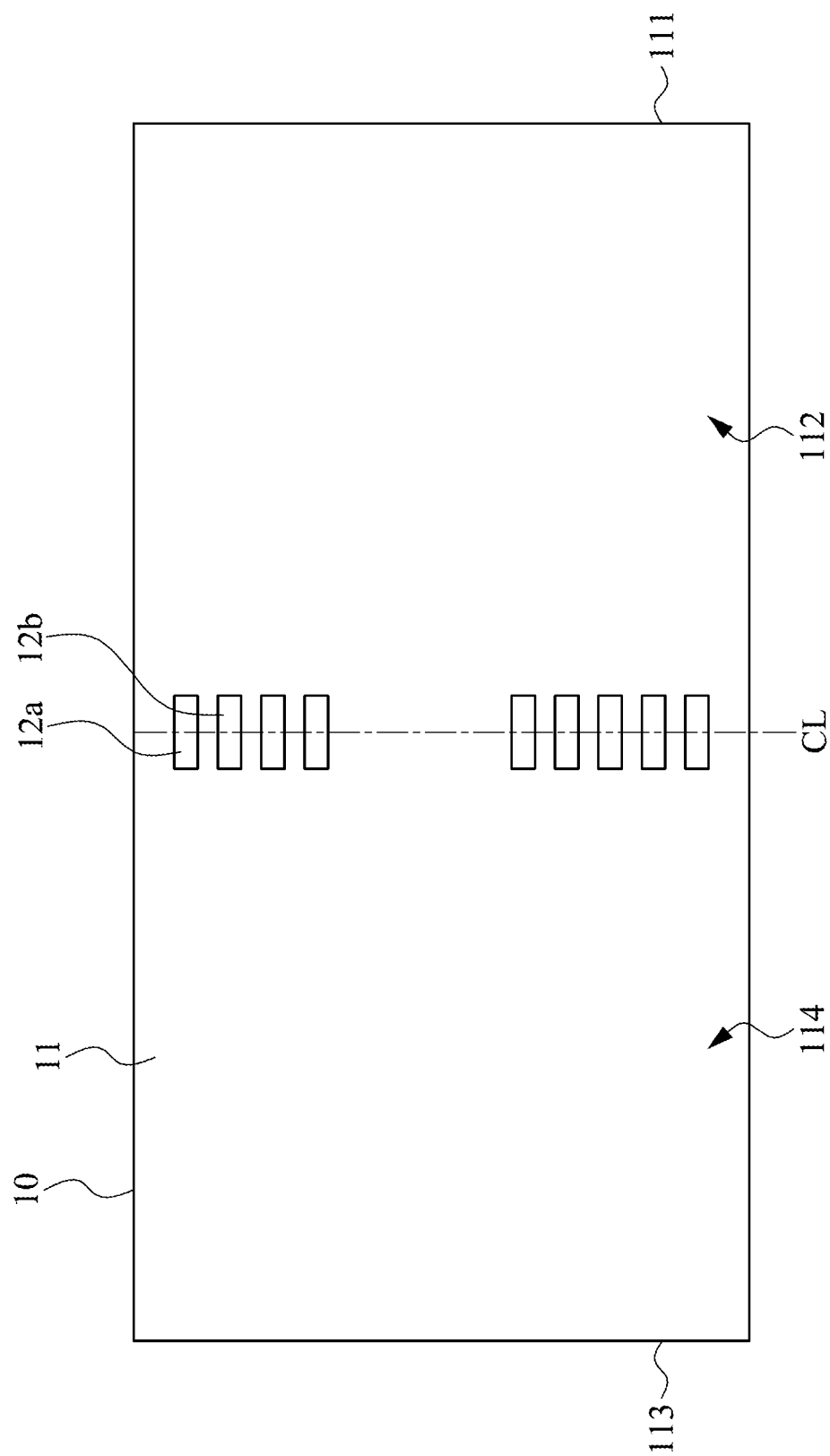
FIG. 1 is a schematic view of a method for packaging a chip-packaged device at a stage for providing a semiconductor chip, according to some embodiments of the present disclosure.

The present disclosure relates to an improvement in semiconductor package. The following description is presented to enable one of ordinary skill in the art to make and use the disclosure as provided in the context of a particular application and its requirements. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

In the figures, the thickness of layers, films, panels, regions, etc., are exaggerated for clarity. Throughout the specification, the same reference numerals denote the same component. It will be understood that when an component such as a layer, a film, a region or a substrate is referred to as "on" or "connected to" another component, intermediate components can also be present. In contrast, when a component is referred to as "directly on" or "directly connected to" another component, no intermediate component can be present. As used herein, "connected" may refer to both physical and/or electrical connections. Furthermore, "electrical connection" or "coupled" may be the presence of other components between two elements.

Reference will now be made in detail to the present embodiments of the disclosure, examples of which are illustrated in the accompanying drawings. Wherever possible, the same reference numbers are used in the drawings and the description to refer to the same or like parts.

A method for manufacturing a semiconductor package is described below, in accordance with some embodiments of the disclosure.

As shown in FIG. 1, the preparation of the semiconductor package begins with providing a semiconductor chip 10. The semiconductor chip 10 may include a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

In addition, the semiconductor chip 10 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, Dynamic random-access memory (DRAM), combinations thereof, and other suitable types of devices.

In some embodiments, the semiconductor chip 10 further includes a number of connection pads, such as connection pads 12a and 12b, formed on a top surface 11 (also referred to as second top surface) of the semiconductor chip 10. In some embodiments, the connection pads 12a and 12b are electrically connected to the microelectronic elements in the semiconductor chip 10 and aligned along a central line CL of the second top surface 11. In some embodiments, the second top surface 11 is divided into a first region 112 and a second region 114. The first region 112 and the second region 114 are located at two opposite sides of the central line CL. The first region 112 extends from the central line CL to a first edge 111 of the semiconductor chip 10, and the second region 114 extends from the central line CL to a second edge 113 of the semiconductor chip 10.

The connection pads 12a and 12b represent any of the various terminals commonly formed near the surface of a semiconductor die through which electrical connections are made between integrated circuit in the die and external circuits. For example, the connection pad 12a may be a power-supply pad (also referred to as third connection pad), the connection pad 12b may be a ground voltage pad (also referred to as fourth connection pad). In some embodiments, the semiconductor chip 10 includes a number of power-supply pads and a number of ground voltage pads; however, for the purpose of clarity the other connection pads are not designated with reference numerals.

Figure 2:
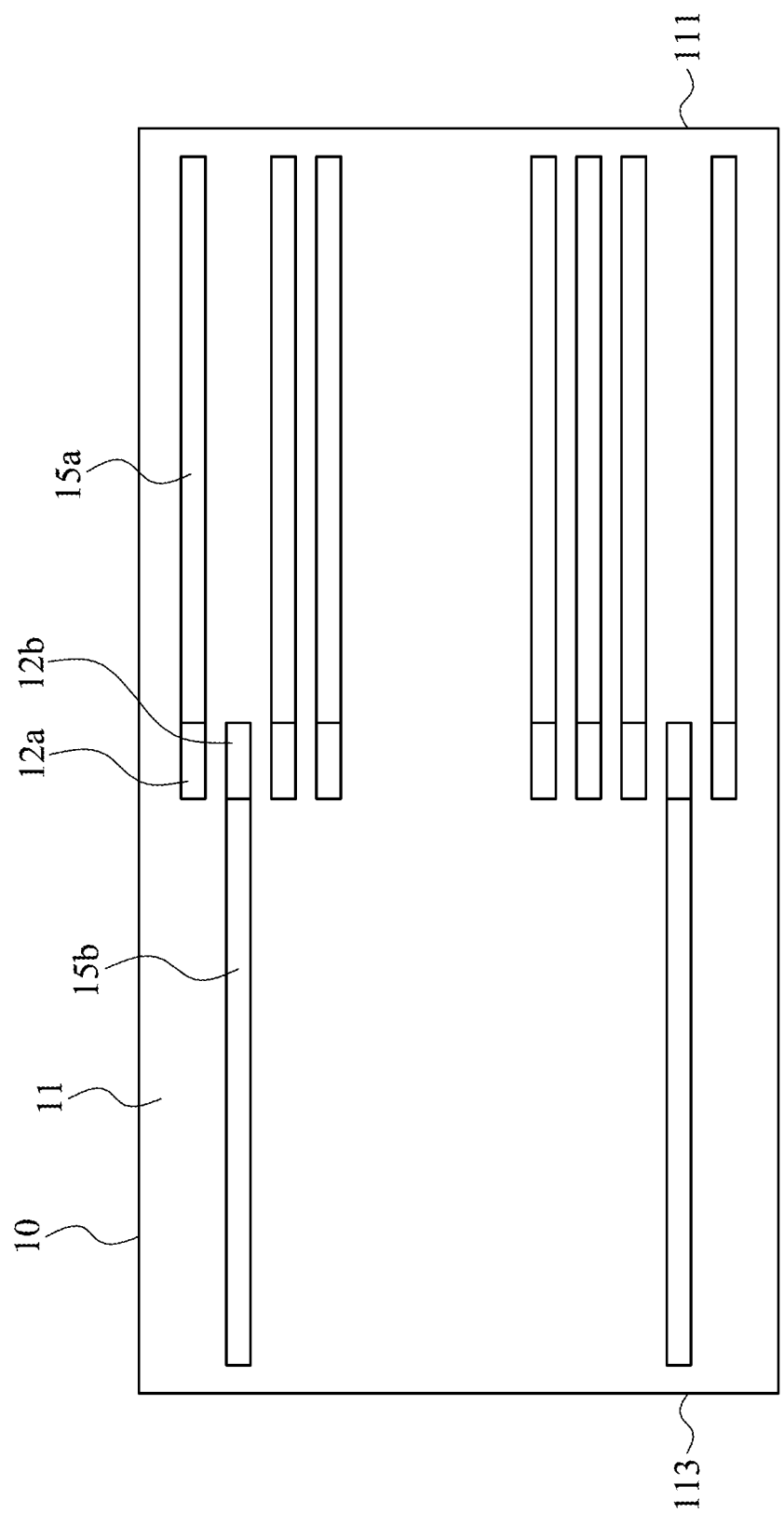
FIG. 2 is a schematic view of a method for packaging a chip-packaged device at a stage for forming redistribution layers, according to some embodiments of the present disclosure.

As shown in FIG. 2, the preparation of the semiconductor package further includes forming redistribution layers, such as redistribution layers 15a and 15b, on the second top surface 11 of the semiconductor chip 10. In the embodiment, each of the redistribution layers 15a and 15b is an extra metal layer on the second top surface 11 that makes the connection pads 12a and 12b of the semiconductor chip 10 are available in other locations of the semiconductor chip 10, for better access to the connection pads 12a and 12b where necessary.

In some embodiments, the redistribution layers 15a and 15b are connected to the connection pads 12a and 12b and extend from the connection pads 12a and 12b to a peripheral of the semiconductor chip 10. Specifically, the redistribution layers 15a connected to the third connection pad 12a extends from the third connection pad 12a to the first edge 111 of the semiconductor chip 10 along an extension direction that is perpendicular to the first edge 111. In addition, the redistribution layers 15b connected to the fourth connection pad 12b extends from the fourth connection pad 12b to the second edge 113 of the semiconductor chip 10 along an extension direction that is perpendicular to the second edge 113.

For the sake of brevity, in the following descriptions, the redistribution layers 15a connected to the third connection pad 12a is referred to as "first redistribution layer", and the redistribution layers 15b connected to the fourth connection pad 12b is referred to as "second redistribution layer". That is, the first redistribution layers 15a are connected to the power-supply pads 12a, and the second redistribution layers 15b are connected to the ground voltage pads 12b. However, the redistribution layers 15a and 15b are not limited to connect to the power-supply pads or the ground voltage pads or any particular connection pads. In addition, the first redistribution layers 15a may extend toward the second edge 113, and the second redistribution layer 15b may extend toward the first edge 111.

Figure 3:
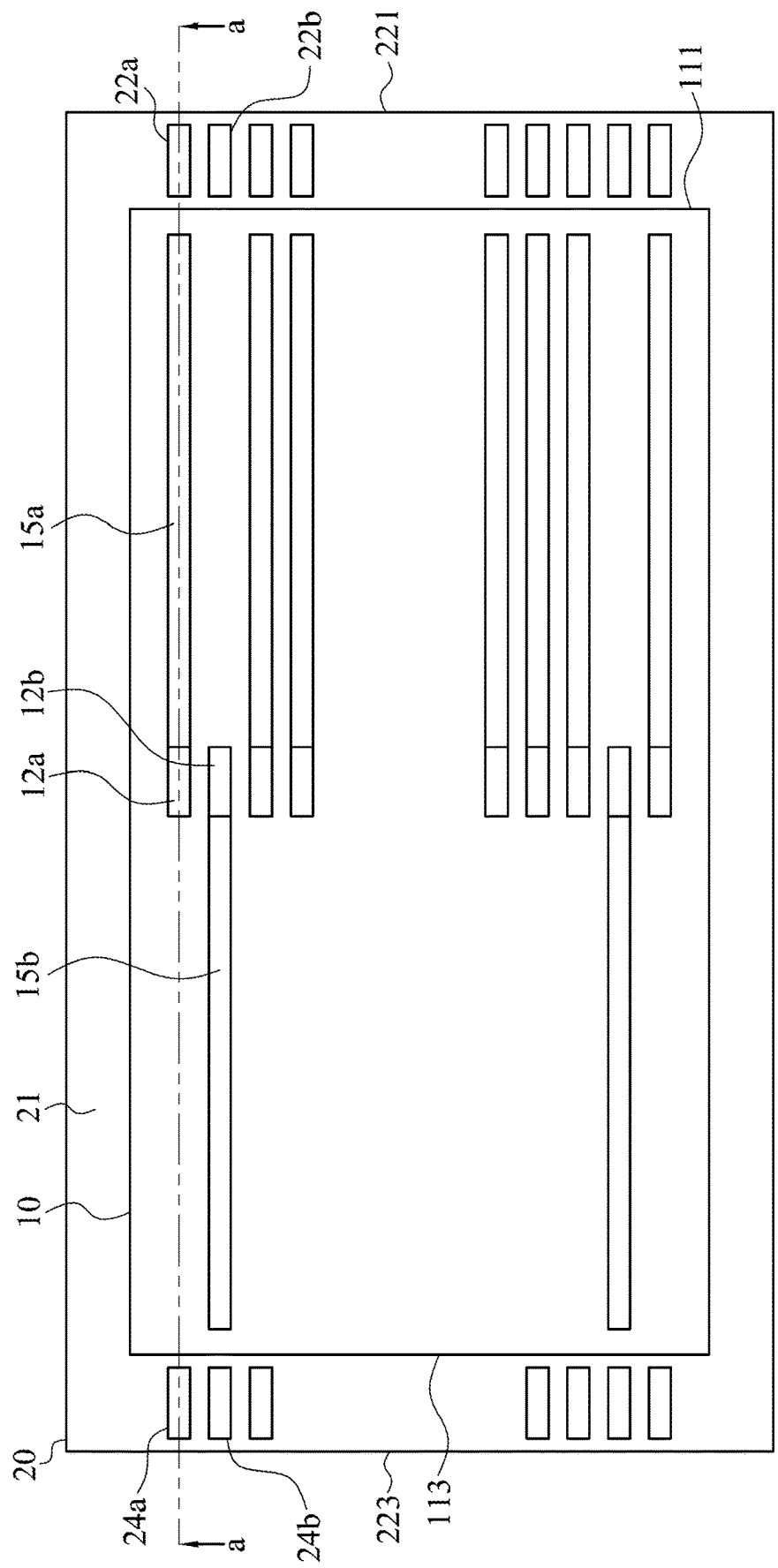
FIG. 3 is a schematic view of a method for packaging a chip-packaged device at a stage for mounting a semiconductor chip on a substrate, according to some embodiments of the present disclosure.
Figure 4:
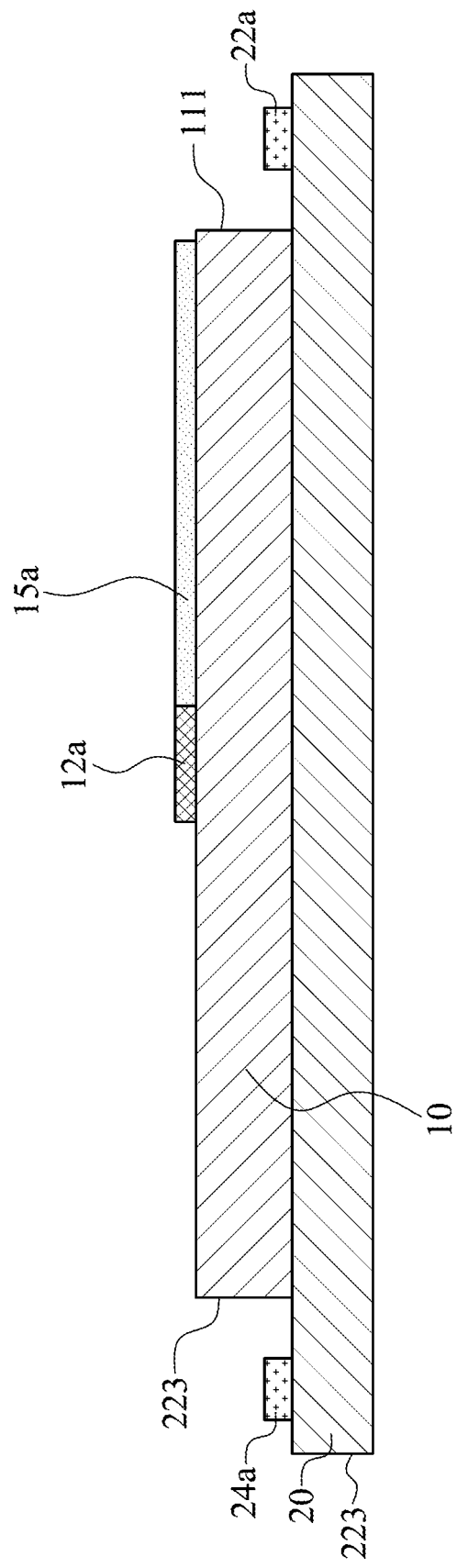
FIG. 4 shows a cross-sectional view taken along a line a-a of FIG. 3.

As shown in FIGS. 3 and 4, the preparation of the semiconductor package further includes coupling the semiconductor chip 10 to a substrate 20. In some embodiments, the substrate 20 may be a printed-circuit board, a ceramic, an organic, glass, and/or semiconductor material or structure, which provides a backplane with power, ground, control, monitoring, etc. The semiconductor chip 10 is placed on a top surface 21 (also referred to as first top surface) of the substrate 20.

In some embodiments, the substrate 20 includes connection pads, such as connection pads 22a, 22b, 24a and 24b, to route electrical signals to or from the semiconductor chip 10. In one embodiment, the connection pads 22a and 22b are located between a first edge 221 of the substrate 20 and the first edge 111 of the semiconductor chip 10, and the connection pads 24a and 24b are located between a second edge 223 of the substrate 20 and the second edge 113 of the semiconductor chip 10.

In some embodiments, either the connection pads 22a and 22b or the connection pads 24a and 24b are aligned with the connection pads 12a and 12b of the semiconductor chip 10 in a straight line that is perpendicular to the first edge 111. For example, the connection pads 22a, the connection pad 12a and the connection pad 24a are arranged along a straight line that is perpendicular to the first edge 111. In addition, the connection pads 22b, the connection pad 12b and the connection pad 24b are arranged along another straight line that is perpendicular to the second edge 113.

In some embodiments, the connection pads that are aligned each other have a related function. For example, as shown in FIG. 3, the connection pad 22a and the connection pad 24a aligned with the third connection pad (power-supply pads) 12a are connected to a power supply. Moreover, the connection pads 22b and the connection pad 24b aligned with the connection pad (ground voltage pads) 12b are grounded. However, the electrical function of the connection pads 22 on the substrate 20 is not limited to the above-mentioned embodiments.

For the sake of brevity, in the following description, the connection pad 22a which is connected to a power supply and next to the first edge 221 is referred to as "first connection pad", the connection pad 22b which is grounded and next to the first edge 221 is referred to as "second connection pad", the connection pad 24a which is connected to a power supply and next to the second edge 223 is referred to as "fifth connection pad", the connection pad 24b which is grounded and next to the second edge 223 is referred to as "sixth connection pad".

Figure 5:
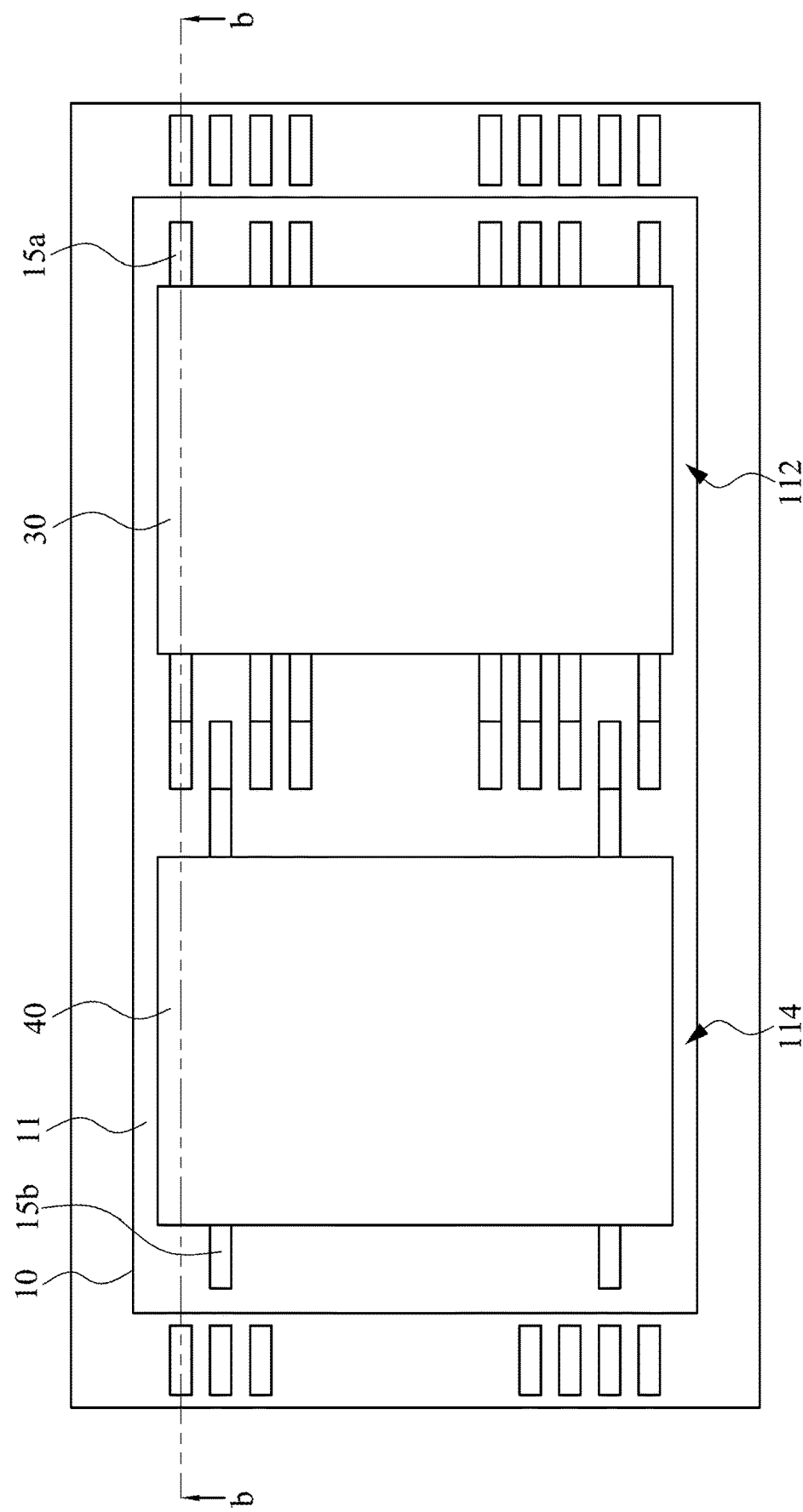
FIG. 5 is a schematic view of a method for packaging a chip-packaged device at a stage for forming lower conductive layers, according to some embodiments of the present disclosure.
Figure 6:
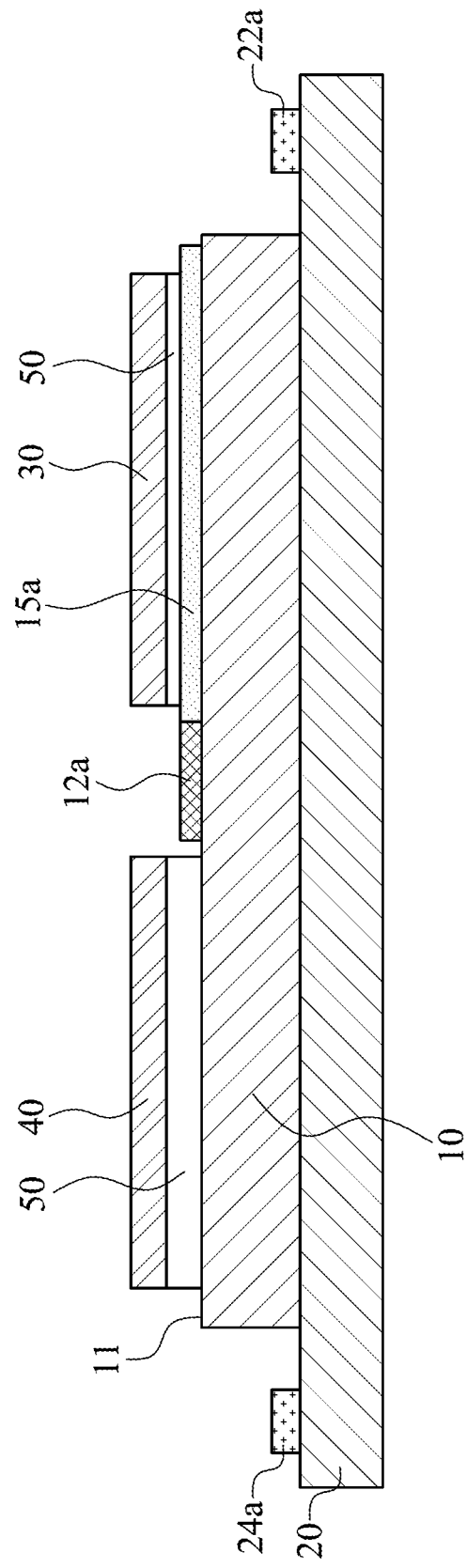
FIG. 6 shows a cross-sectional view taken along a line b-b of FIG. 5.

As shown in FIGS. 5 and 6, the preparation of the semiconductor package further includes forming one or more lower conductive layers (such as first lower conductive layer 30 and second lower conductive layer 40) over the second top surface 11 of the semiconductor chip 10. In some embodiments, the first lower conductive layer 30 is placed over the first region 112 of the second top surface 11, and the second lower conductive layer 40 is placed over the second region 114 of the second top surface 11.

In some embodiments, a projection area of the first lower conductive layer 30 on the second top surface 11 is smaller than an area of the first region 112, and a projection area of the second lower conductive layer 40 on the second top surface 11 is smaller than an area of the second region 114. That is not entire area of the first region 112 and the second region 114 is covered by the above conductive layers. In some embodiments, the first lower conductive layer 30 and the second lower conductive layer 40 are arranged such that one end of each of the redistribution layers 15a and 15b that are adjacent to the edges of the semiconductor chip 10 and the connection pads 12a and 12b are exposed for facilitating a wire bonding process.

The material of the first lower conductive layer 30 and the second lower conductive layer 40 may include metal such as copper or aluminum, or any other metal possessing low resistivity, and the thickness of the first lower conductive layer 30 and the second lower conductive layer 40 falls in a range of 60 micrometer to 100 micrometer. Therefore, the first lower conductive layer 30 and the second lower conductive layer 40 of the embodiment can enhance the connection between the substrate 20 and the semiconductor chip 10.

The first lower conductive layer 30 and the second lower conductive layer 40 may be formed on the semiconductor chip 10 through suitable techniques. For example, as shown in FIG. 6, the first lower conductive layer 30 and the second lower conductive layer 40 are connected to the semiconductor chip 10 via two adhesive layers 50. One of the adhesive layers 50 is disposed between the first lower conductive layer 30 and the semiconductor chip 10, and the other adhesive layers 50 is disposed between the second lower conductive layer 40 and the semiconductor chip 10. The adhesive layers 50 insulate the first lower conductive layer 30 and the second lower conductive layer 40 from the semiconductor chip 10. In other words, the adhesive layers 50 include insulating material, and the adhesive layers 50 are added between lower conductive layers and the semiconductor chip 10 in order to prevent short circuit.

In some embodiments, the adhesive layers 50 may be a bonding film or glue. In some embodiments, a thickness of each of the adhesive layers 50 between the redistribution layers 15a and 15b and the first and second lower conductive layers 30 and 40 is less than a thickness of each of the adhesive layers 50 between the redistribution layers 15a and 15b and the semiconductor chip 10. That is, with the support of the adhesive layers 50, the first and second lower conductive layers 40 are located at the same height relative to the semiconductor chip 10, no matter whether the redistribution layers 15a and 15b is formed therebetween or not.

Figure 7:
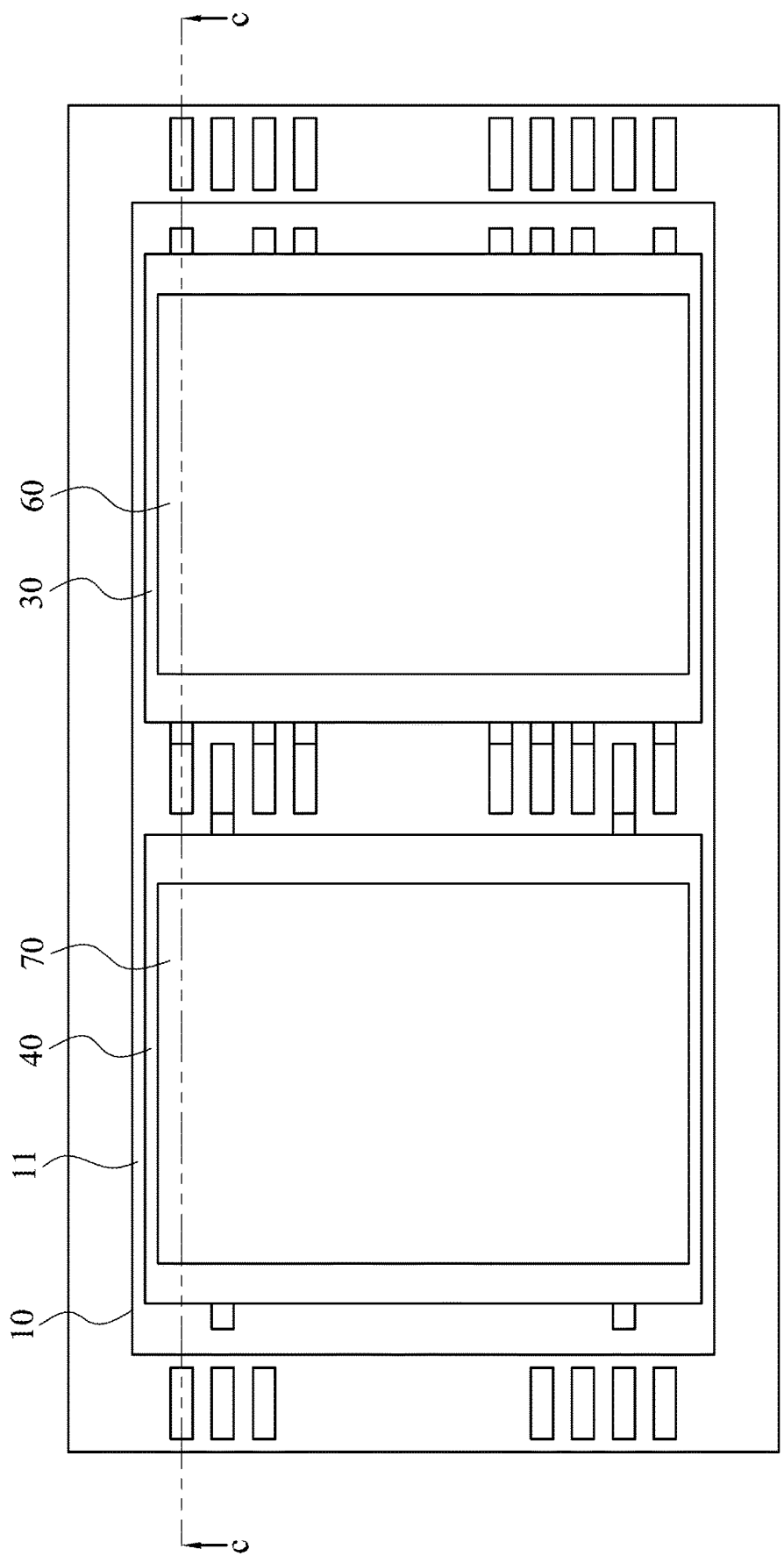
FIG. 7 is a schematic view of a method for packaging a chip-packaged device at a stage for forming upper conductive layers, according to some embodiments of the present disclosure.
Figure 8:
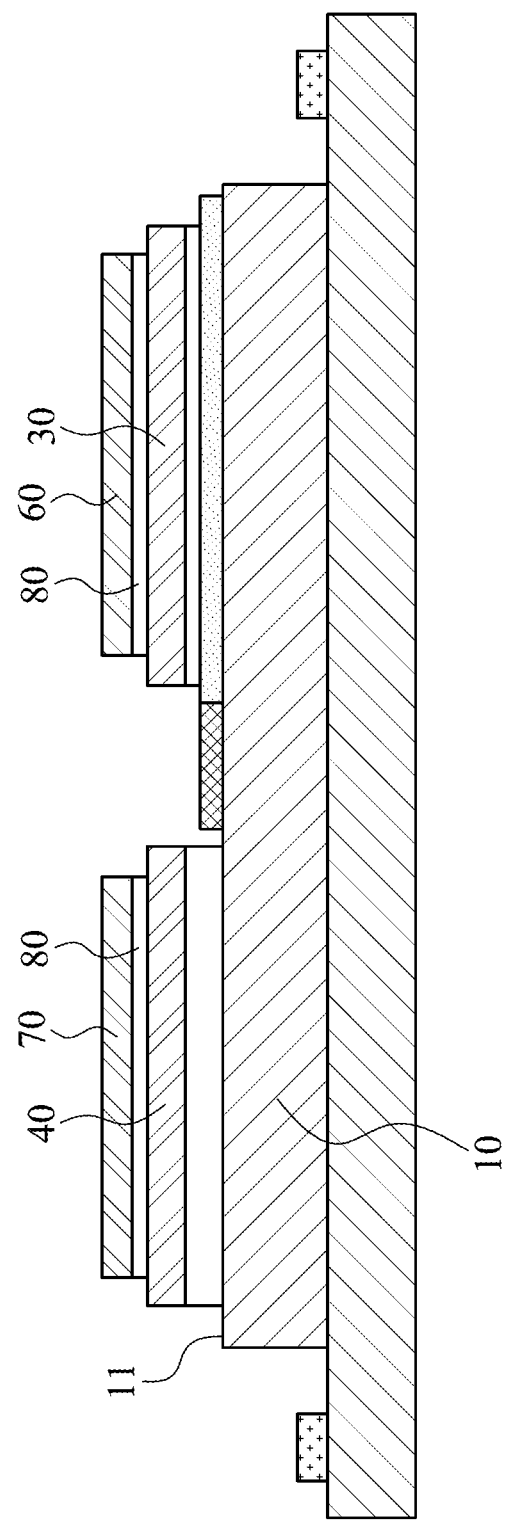
FIG. 8 shows a cross-sectional view taken along a line c-c of FIG. 7.

As shown in FIGS. 7 and 8, the preparation of the semiconductor package further includes forming one or more upper conductive layers (such as first upper conductive layer 60 and second upper conductive layer 70) over the first lower conductive layer 30 and the second lower conductive layer 40. In some embodiments, the first upper conductive layer 60 is placed over the first lower conductive layer 30, and the second upper conductive layer 70 is placed over the second lower conductive layer 40.

In some embodiments, a projection area of the first upper conductive layer 60 on the second top surface 11 is smaller than a projection area of the first lower conductive layer 30 on the second top surface 11, and a projection area of the second upper conductive layer 70 on the second top surface 11 is smaller than a projection area of the second lower conductive layer 40 on the second top surface 11. That is not entire area of the lower conductive layers are covered by the above upper conductive layers so as to expose two opposite sides of the lower conductive layers for wire bonding. In some embodiments, the first upper conductive layer 60 and the second upper conductive layer 70 are arranged such that a peripheral of the corresponding lower conductive layers are exposed so as to facilitate a wire bonding process.

The material of the first upper conductive layer 60 and the second upper conductive layer 70 may include metal such as copper or aluminum, or any other metal possessing low resistivity, and the thickness of the first upper conductive layer 60 and the second upper conductive layer 70 falls in a range of 60 micrometer to 100 micrometer.

The first upper conductive layer 60 and the second upper conductive layer 70 may be formed on the lower conductive layers 30 and 40 through suitable techniques. For example, as shown in FIG. 8, the first upper conductive layer 60 and the second upper conductive layer 70 are connected to the lower conductive layers 30 and 40 via two adhesive layers 80. One of the adhesive layers 80 is disposed between the first upper conductive layer 60 and the first lower conductive layer 30, and the other adhesive layers 80 is disposed between the second upper conductive layer 70 and the second lower conductive layer 40. The adhesive layers 80 insulate the first upper conductive layer 60 and the second upper conductive layer 70 from the lower conductive layers 30 and 40. In other words, the adhesive layers 80 include insulating material, and the adhesive layers 80 is added between upper conductive layers and the lower conductive layers in order to prevent short circuit.

In some embodiments, the adhesive layers 80 may be a bonding film or glue. In some embodiments, a thickness of each of the adhesive layer 80 between the first and second upper conductive layers 60 and 70 and the first and second lower conductive layers 30 and 40 is the same. That is, with the support of the adhesive layers 80, the first and second upper conductive layers 60 and 70 are located at the same height relative to the semiconductor chip 10, no matter whether the redistribution layers 15a and 15b is formed below or not.

Figure 9:
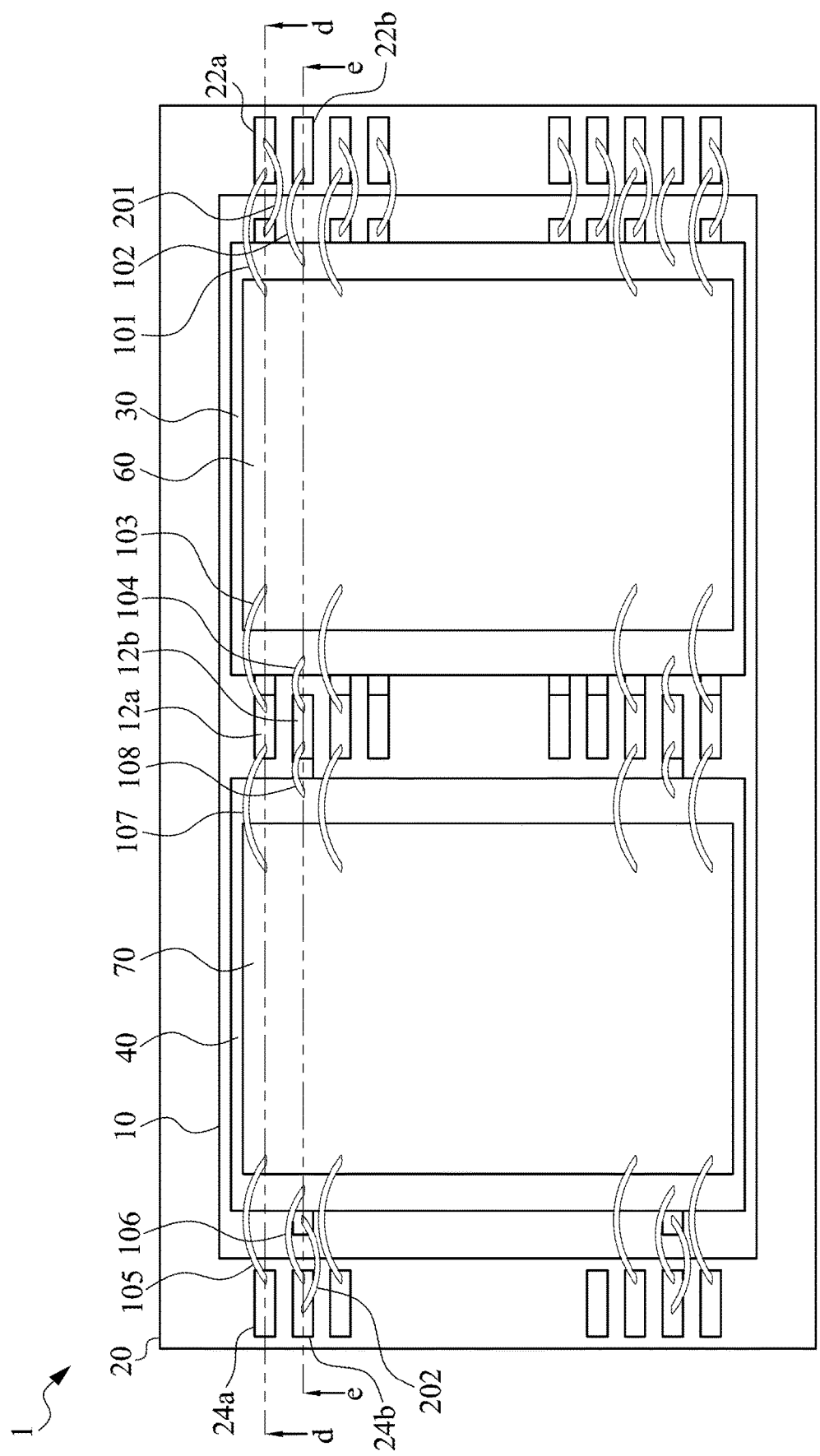
FIG. 9 is a schematic view of a method for packaging a chip-packaged device at a stage of wire bonding process, according to some embodiments of the present disclosure.
Figure 10:
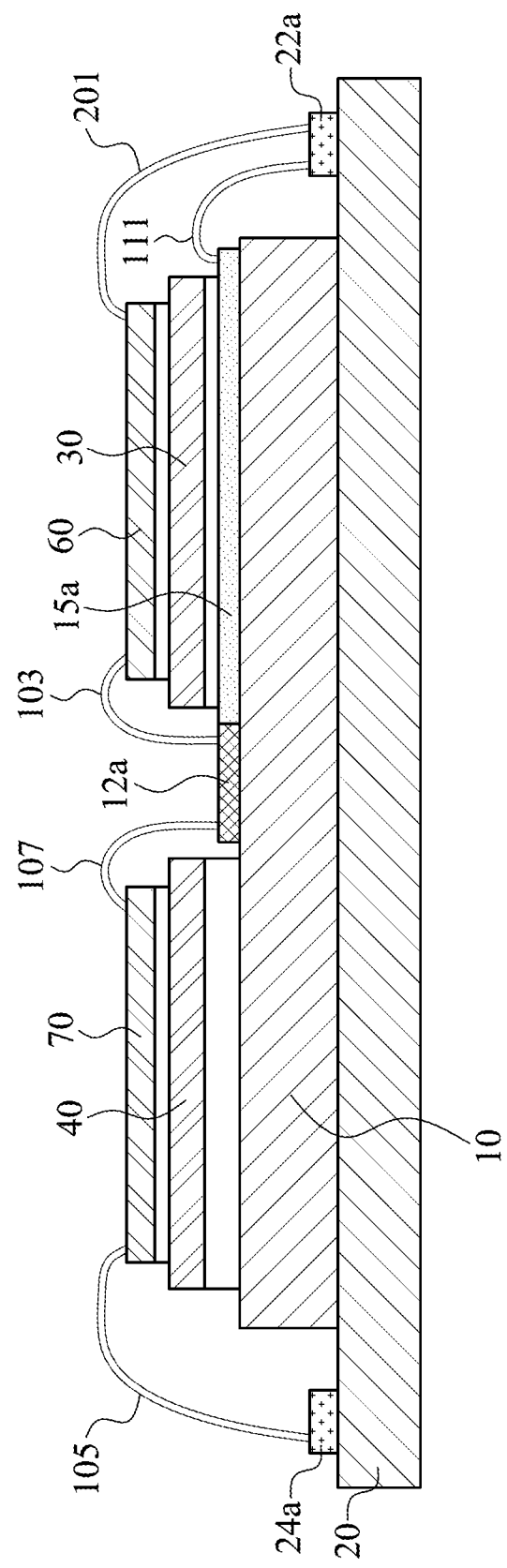
FIG. 10 shows a cross-sectional view taken along a line d-d of FIG. 9.
Figure 11:
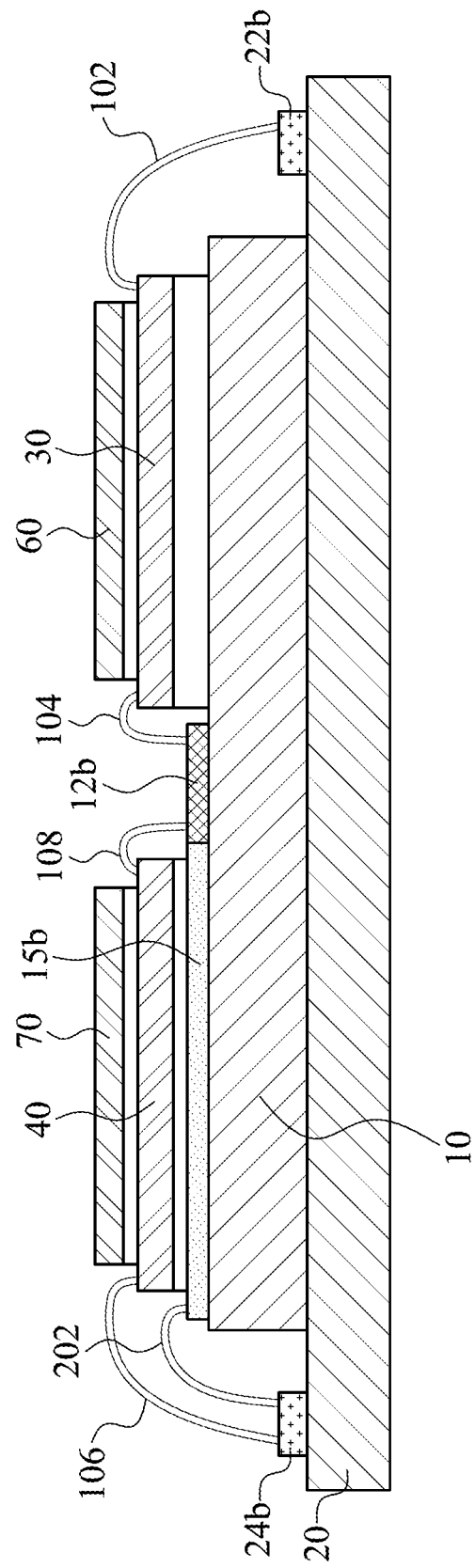
FIG. 11 shows a cross-sectional view taken along a line e-e of FIG. 9.

As shown in FIGS. 9-10, the preparation of the semiconductor package further includes performing a wire boding process. In some embodiments, a number of wirings are used to provide electric connection between the semiconductor chip 10 and the substrate 20. One embodiment for the wire bonding process for the arrangement of the semiconductor chip 10 and the substrate 20 shown in the above embodiments are described below. It is understood that additional wirings can be provided to connect the semiconductor chip 10 and the substrate 20, and some of the wirings described below can be eliminated, for additional embodiments. The order of the operations may be interchangeable and at least some of the operations may be performed in a different sequence. In some embodiments, at least two or more operations/processes are performed overlapping in time, or almost simultaneously.

The wire bonding process includes:
(a) forming a number of first wirings 101 from the first connection pads 22a and the first upper conductive layer 60;
(b) forming a number of second wirings 102 from the second connection pads 22b and the first lower conductive layer 30;
(c) forming a number of third wirings 103 from the third connection pads 12a and the first upper conductive layer 60;

(d) forming a number of fourth wirings 104 from the fourth connection pads 12b and the first lower conductive layer 30;

(e) forming a number of fifth wirings 105 from the fifth connection pads 24a to the second upper conductive layer 70;

(f) forming a number of sixth wirings 106 from the six connection pads 24b to the second lower conductive layer 40;

(g) forming a number of seventh wirings 107 from the third connection pads 12a to the second upper conductive layer 70;

(h) forming a number of eighth wirings 108 from the fourth connection pads 12b to the second lower conductive layer 40;

(i) forming a number of first auxiliary wirings 201 from the first connection pad 22a to the first redistribution layers 15a; and (j) forming a number of second auxiliary wirings 202 from the sixth connection pad 24b to the second redistribution layers 15b. Alternatively, the second auxiliary wirings 202 may be connected between the second connection pad 22b to the second redistribution layer 15b, in cases where the second redistribution layer 15b is disposed on the first region 112 (as shown in FIG. 2) of the semiconductor chip 10.

In some embodiments, the preparation of the semiconductor package further includes encapsulating the semiconductor chip 10, the substrate 20, the conductive layers 30, 40, 60 and 70, the bonding wires 101-108, and auxiliary wirings 201 and 202 by an encapsulating material (not shown in figures). The encapsulating material may include thermosetting epoxy resin. As such, a semiconductor package 1 is formed.

In some embodiments, the first connection pads 22a are connected to a power supply, and the third connection pads 12a are power-supply pads of the semiconductor chip 10. Through the first wiring 101 and the third wiring 103 (or otherwise the sixth wiring 106 and the eighth wiring 108), Vdd (power) signals between the substrate 20 and the semiconductor chip 10 is stably transmitted via the first upper conductive layer 60 (or otherwise the second upper conductive layer 70). As a result, an IR drop issue of the Vdd (power) signals is prevented because the upper conductive layers 60 and 70 provide electrical connection with a lower electrical resistance, in compare with original circuit (e.g., the auxiliary wirings and the first redistribution layers).

In some embodiments, the second connection pads 22b and sixth connection pads 24b are grounded or connected to a ground voltage supply of a power supply, and the fourth connection pads 12b are ground voltage pads of the semiconductor chip 10. Through the second wiring 102 and fourth wiring 104 (or otherwise the sixth wiring 106 and eighth wiring 108), ground signals between the substrate 20 and the semiconductor chip 10 is stably transmitted via the first lower conductive layer 30 (or otherwise the second lower conductive layer 40). As a result, an IR drop issue of the ground signals is prevented because the lower conductive layer 30 and 40 provide electrical connection with a lower electrical resistance, in compare with original circuit (e.g., the auxiliary wirings and the second redistribution layers).

Moreover, since the first lower conductive layer 30 (or otherwise the second lower conductive layer 40) can transmit ground (GND) signals between the substrate 20 and the semiconductor chip 10, and the first upper conductive layer 60 (or otherwise the second upper conductive layer 70) can transmit Vdd (power) signals between the substrate 20 and the semiconductor chip 10, the circuit metal connection between the substrate 20 and the semiconductor chip 10 is enhanced. As a result, the IR shift and signal distortion in both signals is reduced.

In some embodiments, in addition to the first lower and upper conductive layers 30 and 60, the second lower and upper conductive layers 40 and 70 are also implanted on the semiconductor chip 10. The connection pads for the ground signals and the connection pads for the Vdd signals can be wired to left and/or right at the same time. As a result, noise in either Vdd signals or ground signals is reduced.

This disclosure may also be incorporated into a semiconductor package wherein the connection pads of the semiconductor chip 10 are located along the periphery of the semiconductor chip 10. In such embodiment, the second lower conductive layer 40 and the second upper conductive layer 70 are omitted. The connection pads on the semiconductor chip 10 may be located at two opposite sides of the first lower conductive layer 30.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the device of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor package, comprising:
   a substrate comprising:
   a first top surface; and
   a plurality of first connection pads and a plurality of second connection pads disposed on the first top surface;
   a semiconductor chip disposed on the first top surface, wherein the semiconductor chip comprises:
   a second top surface; and
   a plurality of third connection pads and a plurality of fourth connection pads disposed on the second top surface;
   a first lower conductive layer disposed on the second top surface;
   a first upper conductive layer disposed on the first lower conductive layer;
   a plurality of first wirings connecting between the first connection pads and the first upper conductive layer;
   a plurality of second wirings connecting between the second connection pads and the first lower conductive layer;
   a plurality of third wirings connecting between the third connection pads and the first upper conductive layer;
   a plurality of fourth wirings connecting between the fourth connection pads and the first lower conductive layer;
   a plurality of first redistribution layers, disposed on the second top surface and located below the first lower conductive layer, wherein the first redistribution layers are respectively connected to the third connection pads and extend from the third connection pads to a peripheral of the semiconductor chip; and
   a plurality of first auxiliary wirings connecting between the first connection pads and the first redistribution layers.

2. The semiconductor package of claim 1, wherein a projection area of the first lower conductive layer on the second top surface is larger than a projection area of the first upper conductive layer on the second top surface.

3. The semiconductor package of claim 1, wherein a projection area of the first upper conductive layer on the first lower conductive layer exposes two opposite sides of the first lower conductive layer, and the first wirings and the third wirings are connected to the exposed sides of the first lower conductive layer.

4. The semiconductor package of claim 1, further comprising:
a plurality of second redistribution layers, disposed on the second top surface and located below the first lower conductive layer, wherein the second redistribution layers are respectively connected to the fourth connection pads and extend from the fourth connection pads to the peripheral of the semiconductor chip; and
a plurality of second auxiliary wirings connecting between the second connection pads and the second redistribution layers.

5. The semiconductor package of claim 1, further comprising:
an adhesive layer disposed between the first lower conductive layer and semiconductor chip, wherein the adhesive layer insulates the first lower conductive layer from the semiconductor chip.

6. The semiconductor package of claim 1, further comprising:
an adhesive layer disposed between the first lower conductive layer and the first upper conductive layer, wherein the adhesive layer insulates the first lower conductive layer from the first upper conductive layer.

7. The semiconductor package of claim 1, wherein the first connection pads are connected to a power supply, and the third connection pads are power-supply pads of the semiconductor chip.

8. The semiconductor package of claim 1, wherein the second connection pads are grounded, and the fourth connection pads are ground voltage pads of the semiconductor chip.

9. The semiconductor package of claim 1, wherein the third connection pads and the fourth connection pads are arranged along a central line of the second top surface.

10. The semiconductor package of claim 9, wherein the second top surface defines a first region and a second region at two sides of the central line, the first lower conductive layer and the first upper conductive layer are located over the first region;
wherein the semiconductor package further comprises:
a plurality of fifth connection pads and a plurality of sixth connection pads disposed on the second region of the first top surface;
a second lower conductive layer disposed on the second top surface and located over the second region;
a second upper conductive layer disposed on the second lower conductive layer;
a plurality of fifth wirings connecting between the fifth connection pads and the second upper conductive layer;
a plurality of sixth wirings connecting between the sixth connection pads and the second lower conductive layer;
a plurality of seventh wirings connecting between the third connection pads and the second upper conductive layer; and
a plurality of eighth wirings connecting between the fourth connection pads and the second lower conductive layer.

11. The semiconductor package of claim 10, wherein the first connection pads and the second connection pads are located adjacent to a first side of the substrate, and the fifth connection pads and the sixth connection pads are located adjacent to a second side of the substrate that is opposite to the first side.

12. The semiconductor package of claim 11, wherein the fifth connection pads are connected to a power supply.

13. The semiconductor package of claim 11, wherein the sixth connection pads are grounded.

14. A method for manufacturing a semiconductor package, comprising:
placing a semiconductor chip on a first top surface of a substrate, wherein a plurality of first connection pads and a plurality of second connection pads are disposed on the first top surface, and the semiconductor chip comprises a plurality of first redistribution layers disposed on a second top surface and located below a first lower conductive layer;
placing the first lower conductive layer over the second top surface of the semiconductor chip, wherein a plurality of third connection pads and a plurality of fourth connection pads are disposed on the second top surface;
placing a first upper conductive layer over the first lower conductive layer;
forming a plurality of first wirings from the first connection pads and the first upper conductive layer;
forming a plurality of second wirings from the second connection pads and the first lower conductive layer;
forming a plurality of third wirings from the third connection pads and the first upper conductive layer;
forming a plurality of fourth wirings from the fourth connection pads and the first lower conductive layer; and
forming a plurality of first auxiliary wirings connecting between the first connection pads and the first redistribution layers.

15. The method for manufacturing a semiconductor package of claim 14, wherein the semiconductor chip further comprises a plurality of second redistribution layers disposed on the second top surface and located below the first lower conductive layer, and the method further comprises:
forming a plurality of second auxiliary wirings connecting between the second connection pads and the second redistribution layers.

16. The method for manufacturing a semiconductor package of claim 14, wherein the first lower conductive layer is attached to the second top surface via an adhesive layer, and the first upper conductive layer is attached to the first lower conductive layer via another adhesive layer.

17. The method for manufacturing a semiconductor package of claim 14, wherein the first connection pads are connected to a power supply, and the third connection pads are power-supply pads of the semiconductor chip;
wherein the second connection pads are grounded, and the fourth connection pads are ground voltage pads of the semiconductor chip.

18. The method for manufacturing a semiconductor package of claim 14, wherein the semiconductor package further comprises a plurality of fifth connection pads and a plurality of sixth connection pads disposed on the first top surface, and the method further comprising:
placing a second lower conductive layer over the second top surface of the semiconductor chip;
placing a second upper conductive layer over the second lower conductive layer;

forming a plurality of fifth wirings from the fifth connection pads to the second upper conductive layer;
forming a plurality of sixth wirings from the six connection pads to the second lower conductive layer;
forming a plurality of seventh wirings from the third connection pads to the second upper conductive layer; and
forming a plurality of eighth wirings from the fourth connection pads to the second lower conductive layer.

\* \* \* \* \*